United States Patent
Sun

(10) Patent No.: US 6,801,053 B2
(45) Date of Patent: Oct. 5, 2004

(54) LEVEL-SHIFTING CIRCUIT

(75) Inventor: Wein-Town Sun, Kaohsiung (TW)

(73) Assignee: AU Optronics Corp., Hsinchu (TW)

( * ) Notice: Subject to any disclaimer, the term of this patent is extended or adjusted under 35 U.S.C. 154(b) by 132 days.

(21) Appl. No.: 10/325,799

(22) Filed: Dec. 19, 2002

(65) Prior Publication Data
US 2003/0222678 A1 Dec. 4, 2003

(30) Foreign Application Priority Data
Jun. 4, 2002 (TW) .......................................... 91111992 A

(51) Int. Cl.[7] .......................................... H03K 19/0175
(52) U.S. Cl. .............................. 326/68; 326/63; 326/81
(58) Field of Search .............................. 326/63, 68–71, 326/73, 74, 80, 81

(56) References Cited
U.S. PATENT DOCUMENTS
4,486,670 A * 12/1984 Chan et al. ................... 326/81
6,222,384 B1 * 4/2001 Kim ............................. 326/68
6,487,687 B1 * 11/2002 Blake et al. ................. 714/724

* cited by examiner

Primary Examiner—Don Le
(74) Attorney, Agent, or Firm—Fish & Richardson P.C.

(57) ABSTRACT

A level-shifting circuit. The first PMOS transistor includes a first gate, a first drain, and a first source coupled to a first voltage VDD. The second PMOS transistor includes a second gate coupled to the first drain, a second drain coupled to the first gate, and a second source coupled to the first voltage VDD. The first inverse logic gate includes an output terminal and is coupled to the first drain. The second inverse logic gate includes an inverse output terminal and coupled to the second drain. The first NMOS transistor includes a third gate coupled to the first voltage VDD, a third drain coupled to the first drain, and a third source coupled to an inverse input terminal. The second NMOS transistor includes a fourth gate coupled to the first voltage VDD, a fourth drain coupled to the second drain, and a fourth source coupled to an input terminal.

8 Claims, 9 Drawing Sheets

LEVEL-SHIFTING CIRCUIT

CROSS REFERENCE TO RELATED APPLICATIONS

Pursuant to 35 USC §119, this application claims the benefit of Taiwan Patent Application No. 91111992 filed Jun. 4, 2002.

BACKGROUND OF THE INVENTION

The present invention relates in general to a level-shifting circuit. In particular, the present invention relates to a level-shifting circuit using a single power source.

DESCRIPTION OF THE RELATED ART

Level-shifting circuits adjust the input voltage level for specific units. FIG. 1 shows a circuit diagram of a conventional level-shifting circuit. The conventional level-shifting circuit controls a NMOS transistor by a pair of small signals Vin and XVin to lower the lower level small signal to VSS or raise the higher level small signal to VDD.

The conventional level-shifting circuit comprises PMOS transistors P1 and P1', whose sources are coupled to a first power source (9V as an example) with gates coupled to each other's drains, wherein the connection points are labels 10 and 12. The drains of the NMOS transistors N1 and N1' are coupled to the connection points 10 and 12. The sources of the NMOS transistors N1 and N1' are coupled to VSS, and the gates of the NMOS transistors N1 and N1' are connected to the input signals Vin and XVin, respectively. Here, the voltage level of XVin is reversed to Vin. When Vin is at a high level (3.3V as an example), XVin is at a low level. Therefore, NMOS transistor N1 is turned on and lowers the voltage level of the connection point 10 to VSS. Thus, the PMOS P1' is turned on. Since the NMOS transistor N1' is turned off, the signal output from output terminal Vout is VDD. Conversely, when Vin is at a low level, XVin is at a high level (3.3V). Therefore, NMOS transistor N1' is turned on and lowers the voltage level of the connection point 12 to VSS. Thus, the signal output from output terminal Vout is VSS.

To increase voltage lowering speed of the connection points 10 and 12, NMOS transistors N2 and N2' are added. The gates of the NMOS transistors N2 and N2' are coupled to VCC, 3.3V as an example. Thus, the NMOS transistors N2 and N2' are turned on. Therefore, the voltage lowering speeds of the connection points 10 and 12 are increased when the NMOS transistors N1 or N1' are turned on. Thus, the operating speed of the level-shifting circuit is increased, and the timing error is prevented.

However, the conventional level-shifting circuit described above is not suited for low temperature poly silicon (LTPS hereinafter). LTPS products increase electron mobility to increase output current. However, the threshold voltage of the MOS transistor is also increased to about 2.5V. Thus, the NMOS transistors N2 and N2' are often left off. Therefore, the conventional level-shifting circuits meet serious RC delay in high operation frequency when applied to LTPS field.

SUMMARY OF THE INVENTION

The object of the present invention is thus to provide a level-shifting circuit using a single power source to ensure that NMOS transistors N2 and N2' are turned on to raise the output signal to VDD or VSS by a pair of inverse logic gates. Thus, the high level input signal is transformed to VDD and the low level input signal is transformed to VSS even when the voltage level of the input signal is swimming.

To achieve the above-mentioned object, the present invention provides a level-shifting circuit. The first PMOS transistor includes a first gate, a first drain, and a first source coupled to a first voltage VDD. The second PMOS transistor includes a second gate coupled to the first drain, a second drain coupled to the first gate, and a second source coupled to the first voltage VDD. The first inverse logic gate includes an output terminal and is coupled to the first drain. The second inverse logic gate includes an inverse output terminal and is coupled to the second drain. The first NMOS transistor includes a third gate coupled to the first voltage VDD, a third drain coupled to the first drain, and a third source coupled to an inverse input terminal. The second NMOS transistor includes a fourth gate coupled to the first voltage VDD, a fourth drain coupled to the second drain, and a fourth source coupled to an input terminal.

In addition, the present invention provides another level-shifting circuit. The first PMOS transistor includes a first gate, a first drain, and a first source coupled to a first voltage VDD. The second PMOS transistor includes a second gate coupled to the first drain, a second drain coupled to the first gate, and a second source coupled to the first voltage VDD. The first NMOS transistor includes a third gate coupled to the first gate, a third drain coupled to the first drain, and a third source coupled to an inverse input terminal. The second NMOS transistor includes a fourth gate coupled to the second gate, a fourth drain coupled to the second drain, and a fourth source coupled to an input terminal. The third NMOS transistor includes a fifth gate coupled to the input terminal, a fifth drain coupled to an inverse output terminal, and a fifth source coupled to a second voltage VSS. The fourth NMOS transistor includes a sixth gate coupled to the inverse input terminal, a sixth drain coupled to an output terminal, and a sixth source coupled to the second voltage VSS.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

First Embodiment

Figure 1:
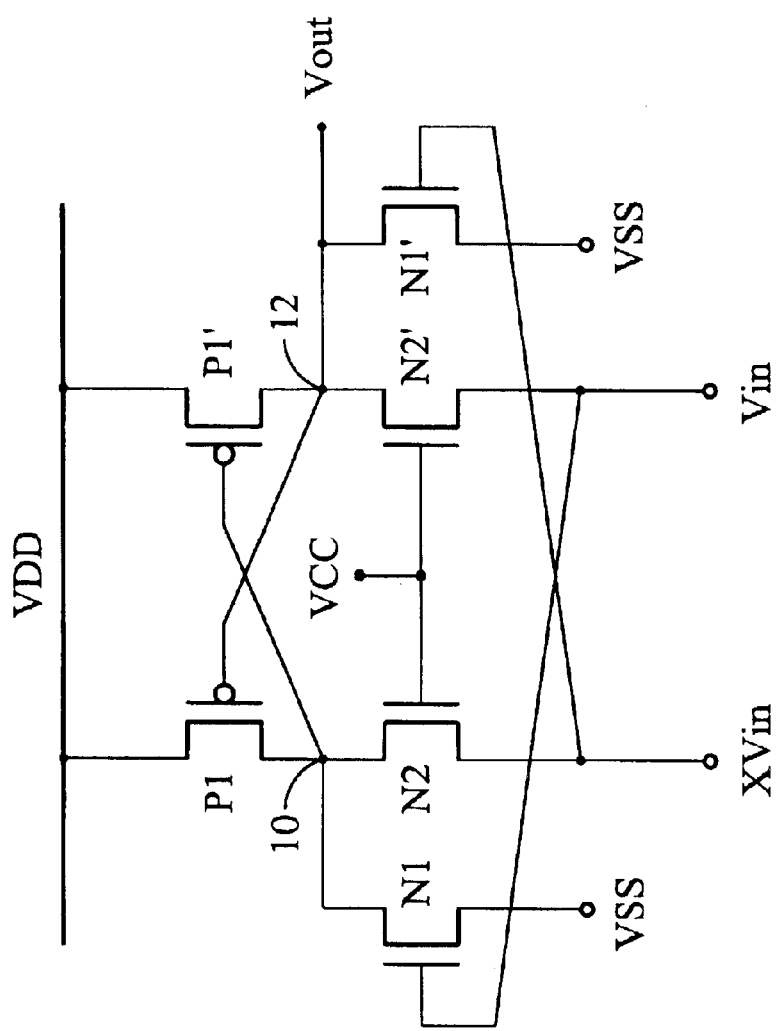
FIG. 1 shows a circuit diagram of a conventional level-shifting circuit.
Figure 2:
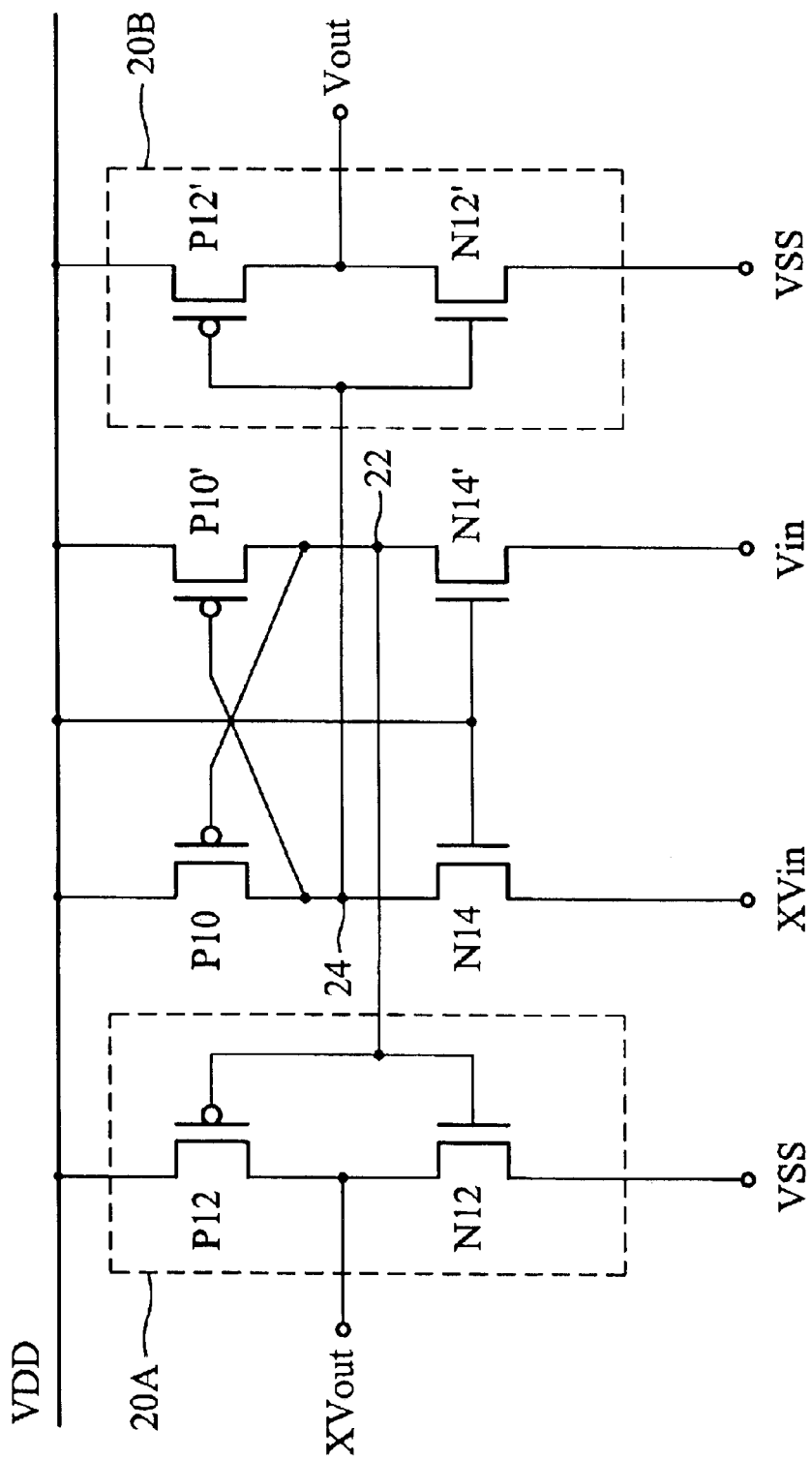
FIG. 2 shows a circuit diagram of a level-shifting circuit according to the first embodiment of the present invention.

FIG. 2 shows a circuit diagram of a level-shifting circuit according to the first embodiment of the present invention. The PMOS transistor P10 comprises a gate, a drain and a source coupled to the power source VDD. The PMOS transistor P10' comprises a gate coupled to the drain of the PMOS transistor P10, a drain coupled to the gate of the PMOS transistor P10 and a source coupled to the power source VDD.

In addition, the level-shifting circuit according to the first embodiment of the present invention further comprises a pair of inverse logic gates 20A and 20B. The inverse logic gate 20A is composed of an NMOS transistor N12 and a PMOS transistor P12. The source of the PMOS transistor P12 is coupled to the power source VDD. The source of the NMOS transistor N12 is coupled to VSS. The gates and sources of the NMOS transistor N12 and the PMOS transistor P12 are coupled to each other. The input of the inverse logic gate 20A, the connection point of the gates of the NMOS transistor N12 and the PMOS transistor P12, is coupled to the connection point 22 of the PMOS transistor P10' and the NMOS transistor N14'. The connection point of the drains of the NMOS transistor N12 and the PMOS transistor P12 is the output terminal XVout of the inverse logic gate 20A.

The inverse logic gate 20B is composed of an NMOS transistor N12' and a PMOS transistor P12'. The source of the PMOS transistor P12' is coupled to the power source VDD. The source of the NMOS transistor N12' is coupled to VSS. The gates of the NMOS transistor N12' and the PMOS transistor P12' are coupled to each other. The drains of the NMOS transistor N12' and the PMOS transistor P12' are coupled to each other. The input of the inverse logic gate 20B, the connection point of the gates of the NMOS transistor N12' and the PMOS transistor P12', is coupled to the connection point 24 of the PMOS transistor P10 and the NMOS transistor N14. The connection point of the drains of the NMOS transistor N12' and the PMOS transistor P12' is the output terminal Vout of the inverse logic gate 20B.

In addition, the level-shifting circuit according to the first embodiment of the present invention further comprises the NMOS transistors N14 and N14'. The gates of the NMOS transistors N14 and N14' are coupled to the power source VDD, and their drains are coupled to the connection points 24 and 22, respectively. The source of the NMOS transistors N14 is coupled to the inverse input terminal XVin, and the source of the NMOS transistors N14' is coupled to the input terminal Vin.

The signals of Vin and XVin are inversed. Thus, when Vin is at a high voltage level (3.3V as an example), XVin is at a low voltage level. Because the gates of the NMOS transistors N14 and N14' are all connected to VDD, about 9V, and higher than the threshold voltage of the NMOS transistor, the NMOS transistors N14 and N14' are turned on. Thus, the connection point 24 is at a low voltage level and the PMOS transistor P12' is turned on to output a high level signal from output terminal Vout. When Vin is at a low voltage level, XVin is at a high voltage level (3.3V as an example). Because the NMOS transistors N14 and N14' are turned on, the connection point 24 is at a high voltage level and the NMOS transistor N12' is turned on to output low level signal VSS from output terminal Vout.

Figure 3A:
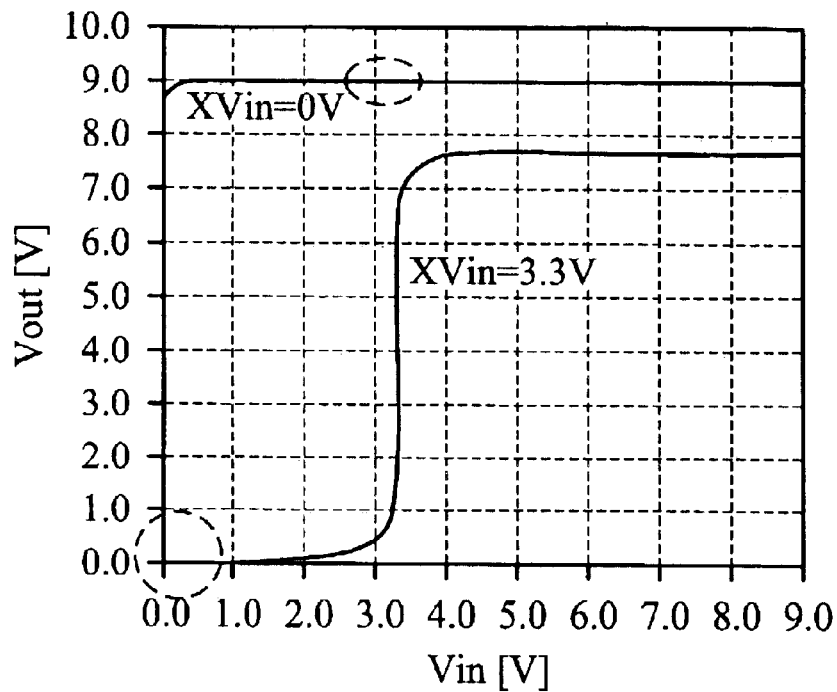
FIG. 3A is the output characteristic chart of the level-shifting circuit according to the first embodiment of the present invention.

FIG. 3A shows the output characteristic chart of the level-shifting circuit according to the first embodiment of the present invention. The curve [XVin=3.3 v] represents the output voltage of Vout when the constant voltage 3.3V is input to XVin, and voltage from 0V to 9V is input to the input terminal Vin. The other curve represents the output voltage of Vout when the constant voltage 0V is input to XVin, and voltage from 9V to 0V is input to the input terminal Vin. As shown in FIG. 3A, when the voltage of the input terminal Vin is lowered to 3V, the output voltage of Vout still maintains high voltage level. Thus, the level-shifting circuit according to the first embodiment of the present invention separates the small signals with high and low levels and is allowed high tolerance.

Figure 3B:
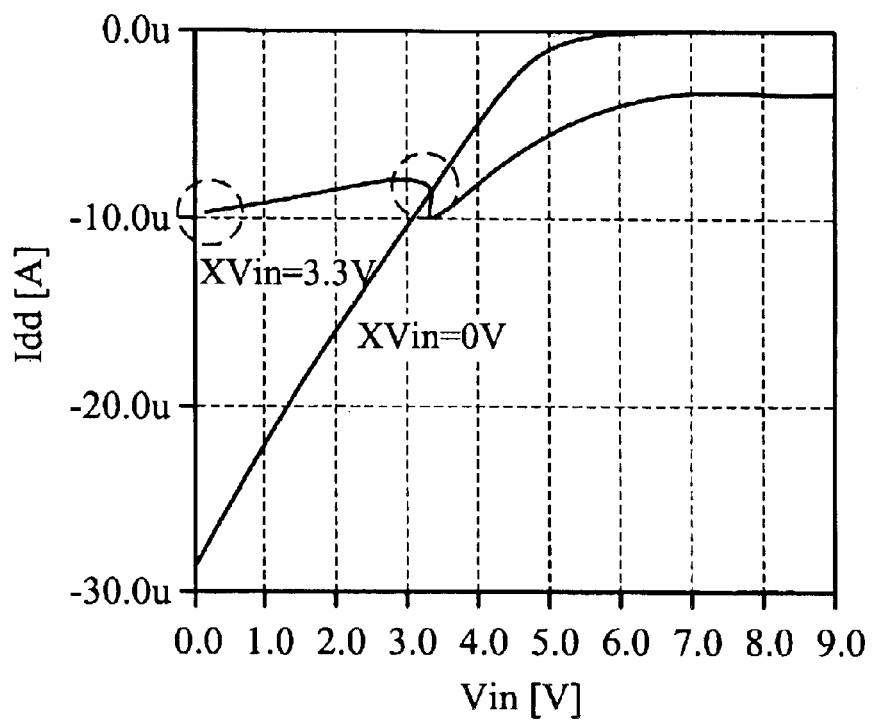
FIG. 3B shows the relationship between the direct current Idd and Vin according to the first embodiment of the present invention.

FIG. 3B shows the relationship between the direct current Idd and Vin according to the first embodiment of the present invention. As shown in FIG. 3B, the direct current provided by the power supply is 9 uA when the Vin is at 0V and 3.3V. Thus, RC delay in the conventional level-shifting circuit is avoided.

Second Embodiment

Figure 4:
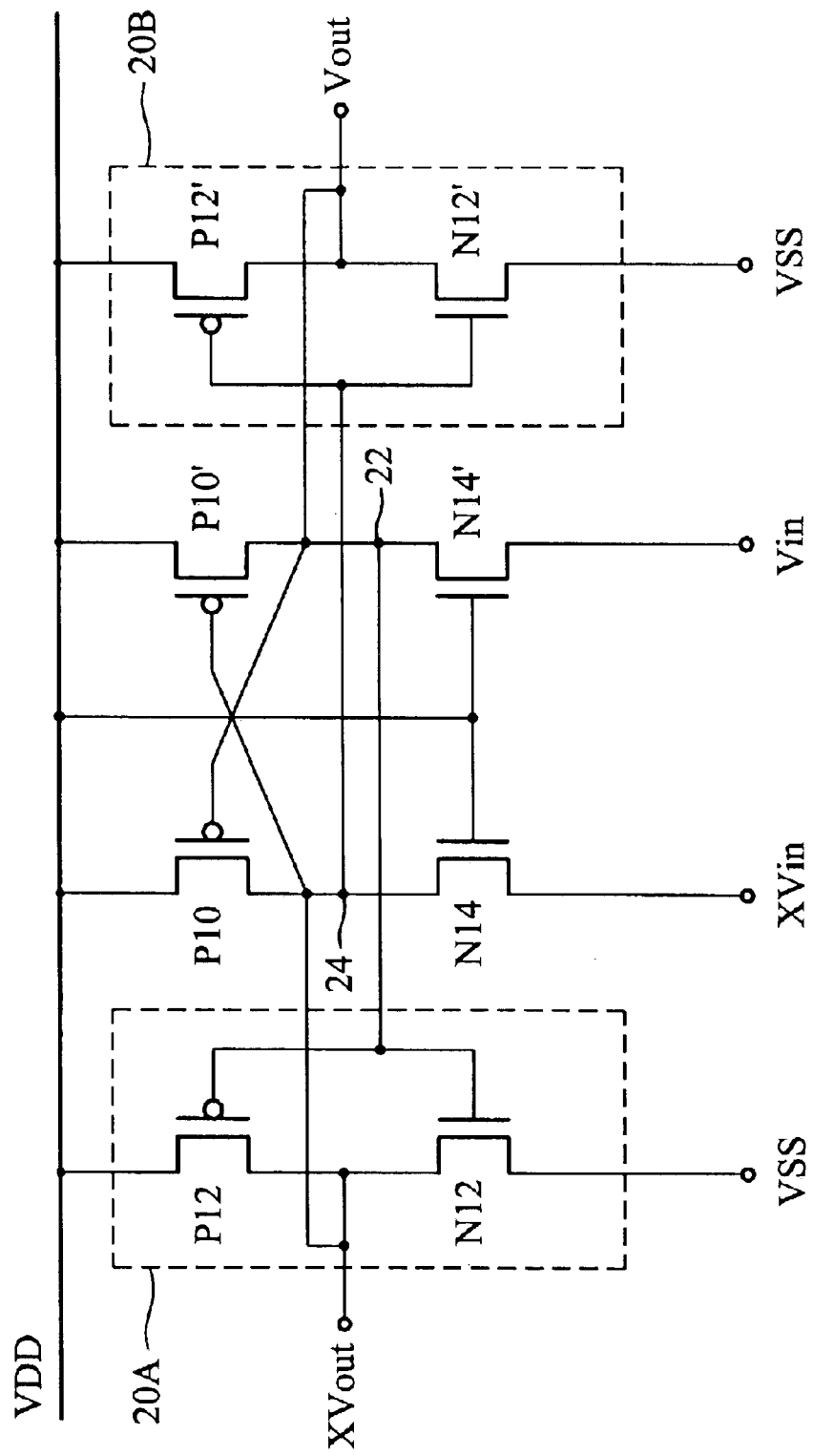
FIG. 4 shows a circuit diagram of a level-shifting circuit according to the second embodiment of the present invention.

FIG. 4 shows a circuit diagram of a level-shifting circuit according to the second embodiment of the present invention. The difference between the first and second embodiments is that the gate of the PMOS transistor P10 is connected to the output terminal Vout and the gate of the PMOS transistor P10' is connected to the inverse output terminal XVout.

Figure 5A:
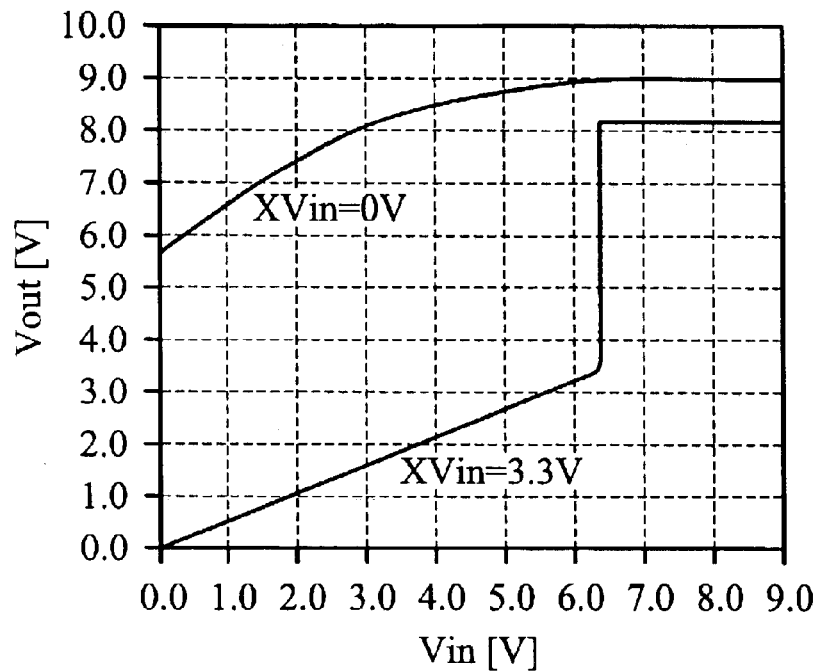
FIG. 5A is the output characteristic chart of the level-shifting circuit according to the second embodiment of the present invention.

FIG. 5A is the output characteristic chart of the level-shifting circuit according to the second embodiment of the present invention. FIG. 5A shows that the level-shifting circuit according to the second embodiment of the present invention separates the small signals with high and low levels and is allowed high input tolerance.

Figure 5B:
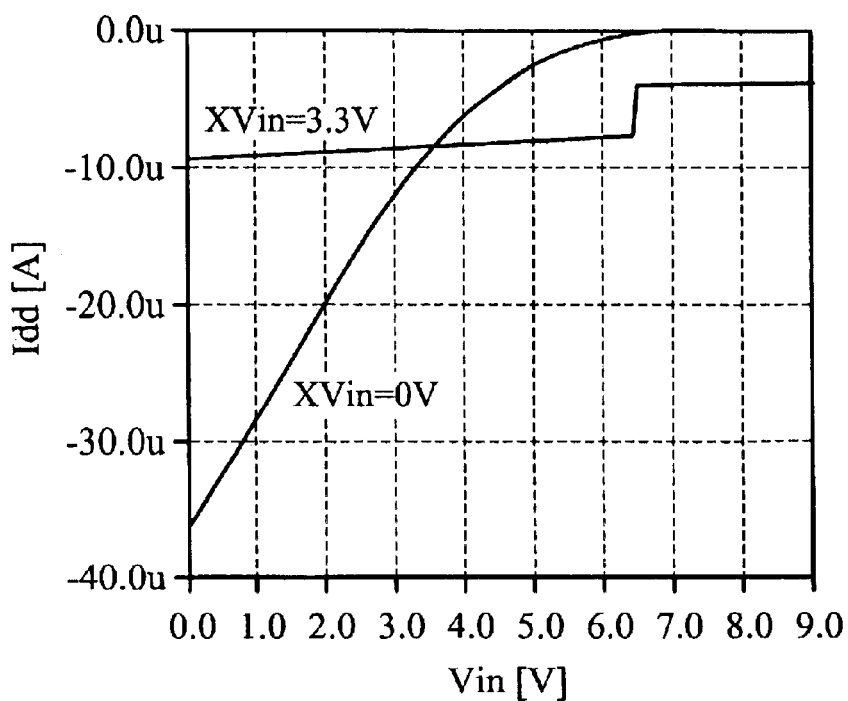
FIG. 5B shows the relationship between the direct current Idd and Vin according to the second embodiment of the present invention.

FIG. 5B shows the relationship between the direct current Idd and Vin according to the second embodiment of the present invention. As shown in FIG. 5B, the direct current provided by the power supply are under 10 uA when the Vin is at 0V and 3.3V.

Accordingly, the gates of the NMOS transistors N14 and N14' of the level-shifting circuit according to the first embodiment and second embodiment of the present invention are connected to VDD (9V). Thus, the NMOS transistors N14 and N14' are ensured on, suitable for LTPS products. Moreover, a pair of inverse logic gates pulls the output signal up/downs to VDD or VSS. Thus, the high level input signal is transformed to VDD and the low level input signal is transformed to VSS even when the voltage level of the input signal is swimming.

Third Embodiment

Figure 6:
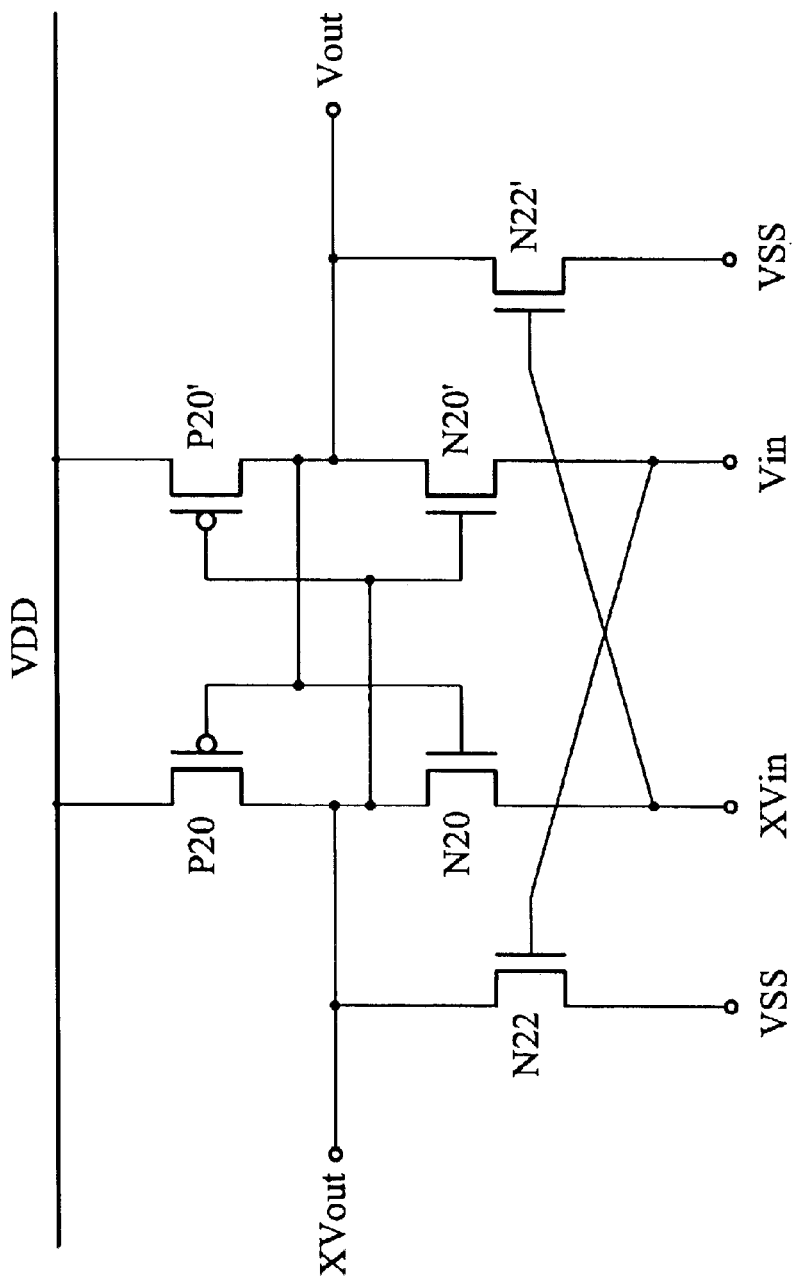
FIG. 6 shows a circuit diagram of a level-shifting circuit according to the third embodiment of the present invention.

FIG. 6 shows a circuit diagram of a level-shifting circuit according to the third embodiment of the present invention. PMOS transistors P20 and P20' comprise gates, drains, and sources coupled to the power source VDD. The gate of the PMOS transistor P20' is coupled to the drain of the PMOS transistor P20, and the drain of the PMOS transistor P20' is coupled to the gate of the PMOS transistor P20.

The gates and drains of the NMOS transistor N20 and the PMOS transistor P20 are coupled to each other. The connection point of the gates of the NMOS transistor N20 and the PMOS transistor P20 is coupled to the output terminal Vout of the level-shifting circuit, and the connection point of drains of the NMOS transistor N20 and the PMOS transistor P20 is coupled to the inverse output terminal XVout of the level-shifting circuit. Here, the NMOS transistor N20 and the PMOS transistor P20 form an inverse logic gate.

In addition, the gates and drains of the NMOS transistor N20' and the PMOS transistor P20' are coupled to each other. The connection point of the gates of the NMOS transistor N20' and the PMOS transistor P20' is coupled to the inverse output terminal XVout of the level-shifting circuit, and the connection point of drains of the NMOS transistor N20' and the PMOS transistor P20' is coupled to the output terminal Vout of the level-shifting circuit. Here, the NMOS transistor N20, the PMOS transistor P20, the NMOS transistor N20' and the PMOS transistor P20' form a latch circuit.

In addition, the level-shifting circuit according to the third embodiment of the present invention further comprises an NMOS transistor N22 and N22'. The gate of the NMOS transistor N22 is coupled to the input terminal Vin, the drain of the NMOS transistor N22 is coupled to the inverse output terminal XVout, and source of the NMOS transistor N22 is coupled to VSS. In addition, the gate of the NMOS transistor N22' is coupled to the inverse input terminal XVin, the drain of the NMOS transistor N22' is coupled to the output terminal Vout, and source of the NMOS transistor N22' is coupled to VSS.

The signals of Vin and XVin are inverted. Thus, when Vin is at a high voltage level (3.3V as an example), XVin is at a low voltage level. The NMOS transistors N22 are turned on, so the inverse output terminal XVout is at a low voltage level and turns on the PMOS transistor P20'. Thus, the output terminal Vout is at a high voltage level. The high voltage level signal of the output terminal Vout is fed back to the connection point of the gates of the PMOS transistor P20 and the NMOS transistor N20 to turn on NMOS transistor N20 and stays the inverse output terminal XVout output low voltage level signal.

When Vin is at a low voltage level, XVin is at a high voltage level. The NMOS transistors N22' are turned on, so the output terminal Vout is at a low voltage level and turns on the PMOS transistor P20. Thus, the inverse output terminal XVout is at a high voltage level. The high voltage level signal of the inverse output terminal XVout is fed back to the connection point of the gates of the PMOS transistor P20' and the NMOS transistor N20' to turn on NMOS transistor N20' and stays the output terminal Vout output low voltage level signal. Therefore, the signal latching stabilizes and speeds up the output state of the level-shifting circuit according to the embodiment of the present invention.

Figure 7:
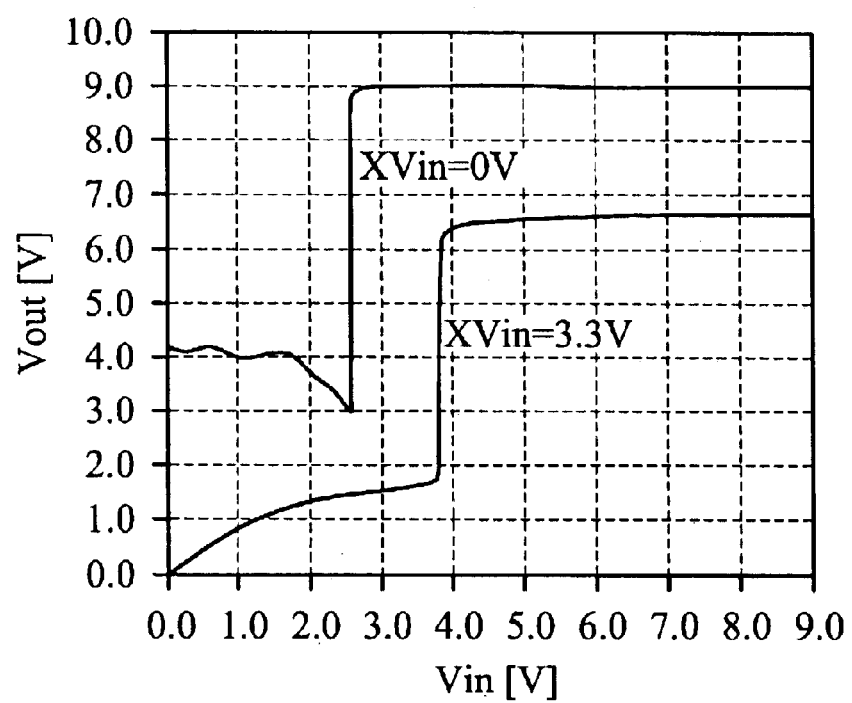
FIG. 7 is the output characteristic chart of the level-shifting circuit according to the third embodiment of the present invention.

FIG. 7 shows the output characteristic chart of the level-shifting circuit according to the third embodiment of the present invention. As shown in FIG. 7, the output voltage of the level-shifting circuit according to the third embodiment of the present invention stays at a high voltage level or low voltage level even when the input signal of Vin swims at 0V and 3.3V. Thus, the level-shifting circuit according to the third embodiment of the present invention allows high input tolerance.

Fourth Embodiment

Figure 8:
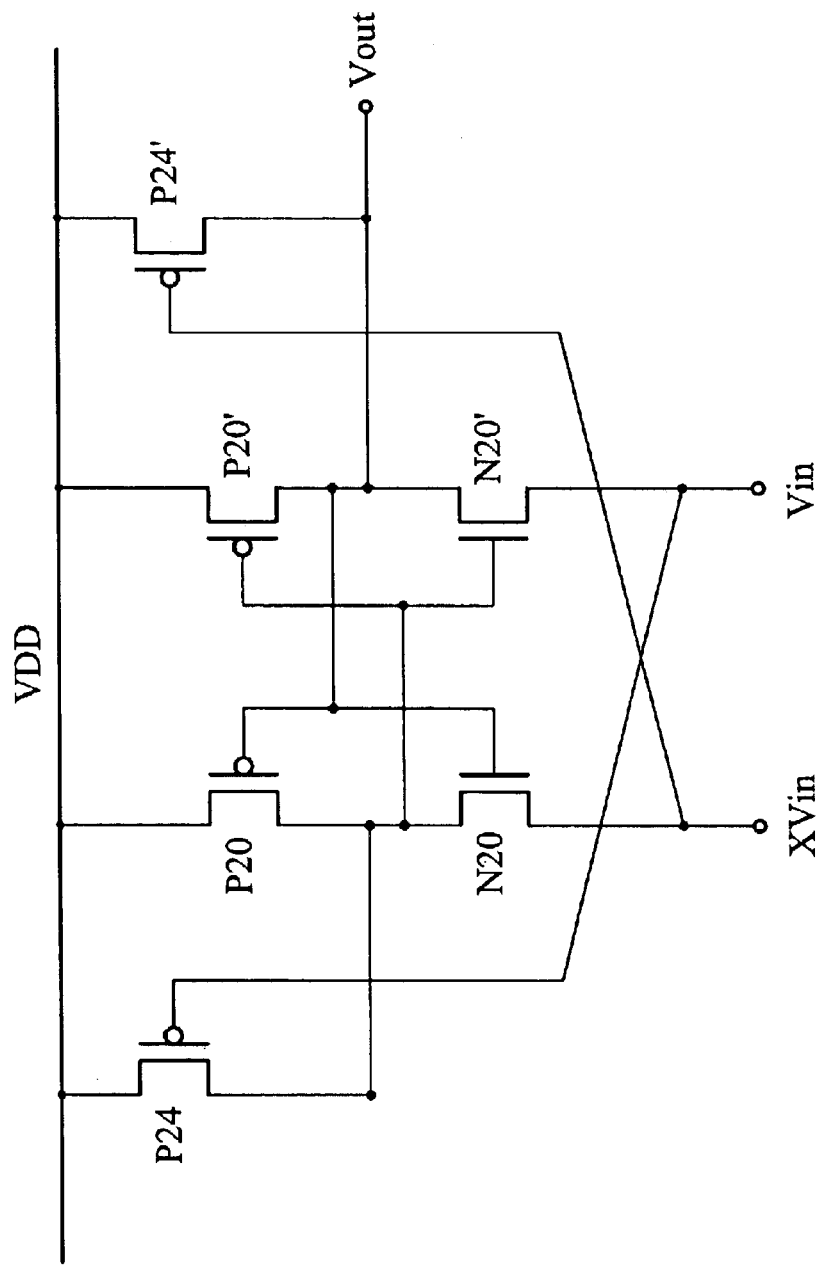
FIG. 8 shows a circuit diagram of a level-shifting circuit according to the fourth embodiment of the present invention.

FIG. 8 shows a circuit diagram of a level-shifting circuit according to the fourth embodiment of the present invention. The difference between the fourth and third embodiments is that the PMOS transistors P24 and P24' are replaced with NMOS transistors N22 and N22', and the sources are coupled to VDD. Because the material characteristic of the PMOS transistor is more stable, the level-shifting circuit according to the fourth embodiment of the present invention has better noise tolerance.

Figure 9A:
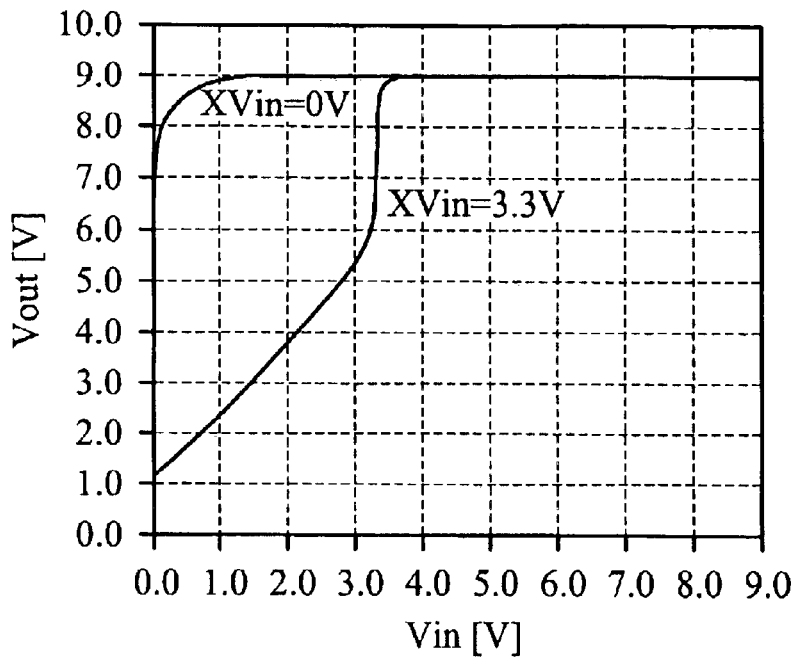
FIG. 9A is the output characteristic chart of the level-shifting circuit according to the fourth embodiment of the present invention.

FIG. 9A is the output characteristic chart of the level-shifting circuit according to the fourth embodiment of the present invention. As shown in FIG. 9A, the output voltage of the level-shifting circuit according to the fourth embodiment of the present invention stays at a high voltage level or low voltage level even when the input signal of Vin swims at 0V and 3.3V. Thus, the level-shifting circuit according to the third embodiment of the present invention allows high input tolerance.

Figure 9B:
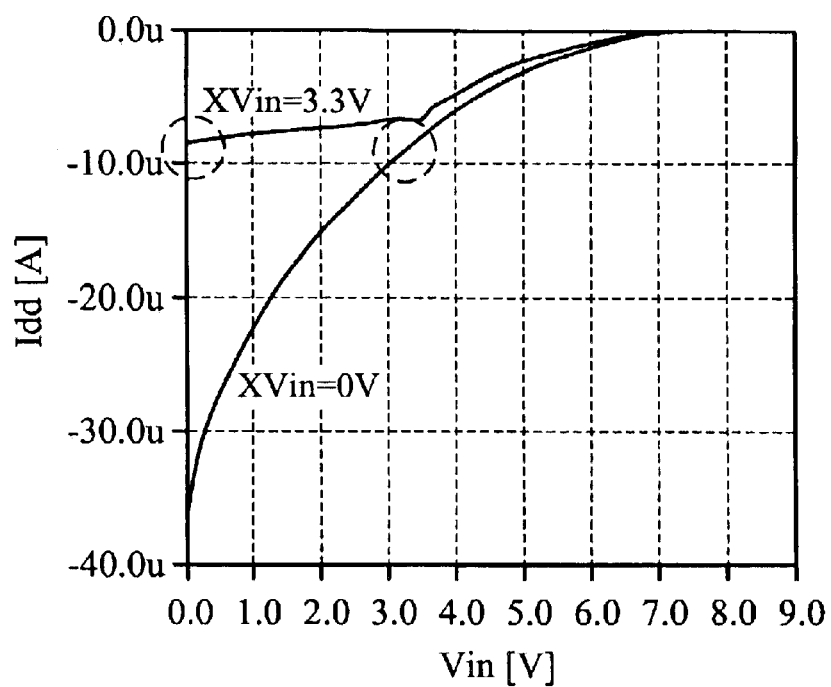
FIG. 9B shows the relationship between direct currents Idd and Vin according to the fourth embodiment of the present invention.

FIG. 9B shows the relationship between the direct current Idd and Vin according to the fourth embodiment of the present invention. As shown in FIG. 9B, the direct current provided by the power supply is under 10 uA when the Vin is at 0V and 3.3V.

Accordingly, the NMOS transistors N20 and N20' and the PMOS transistors P20 and P20' in the level-shifting circuit according to the third and fourth embodiments of the present invention form a latch circuit, which amplifies the small differential signal to a high voltage level and is suitable for LTPS circuit. Thus, the high level input signal is transformed to VDD and the low level input signal is transformed to VSS even when the voltage level of the input signal is swimming.

Moreover, the level-shifting circuit according to the present invention can output stable voltage and avoid RC delay at a high operating frequency. In addition, the level-shifting circuit according to the present invention only uses a single power source and ensures that the NMOS transistors are turned on. A pair of inverse logic gates pulls the output signal up/down to VDD or VSS. Thus, the high level input signal is transformed to VDD and the low level input signal is transformed to VSS even when the voltage level of the input signal is swimming.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A level-shifting circuit, comprising:
    a first PMOS transistor having a first gate, a first drain, and a first source coupled to a first voltage VDD;
    a second PMOS transistor having a second gate coupled to the first drain, a second drain coupled to the first gate, and a second source coupled to the first voltage VDD;
    a first inverse logic gate having an output terminal and coupled to the first drain;
    a second inverse logic gate having an inverse output terminal and coupled to the second drain;
    a first NMOS transistor having a third gate coupled to the first voltage VDD, a third drain coupled to the first drain, and a third source coupled to an inverse input terminal; and
    a second NMOS transistor having a fourth gate coupled to the first voltage VDD, a fourth drain coupled to the second drain, and a fourth source coupled to an input terminal.

2. The level-shifting circuit as claimed in claim 1, wherein the second gate is coupled to the inverse output terminal.

3. The level-shifting circuit as claimed in claim 1, wherein the first inverse logic gate further comprises:
   a third PMOS transistor having a fifth gate coupled to the first drain, a fifth drain coupled to the inverse output terminal, and a fifth source coupled to the first voltage VDD; and
   a third NMOS transistor having a sixth gate coupled to the fifth gate, a sixth drain coupled to the fifth drain, and a sixth source coupled to a second voltage VSS.

4. The level-shifting circuit as claimed in claim 1, wherein the second inverse logic gate further comprises:
   a fourth PMOS transistor having a seventh gate coupled to the second drain, a seventh drain coupled to the output terminal, and a seventh source coupled to the first voltage VDD; and
   a fourth NMOS transistor having a eighth gate coupled to the seventh gate, a eighth drain coupled to the seventh drain, and a eighth source coupled to the second voltage VSS.

5. A level-shifting circuit, comprising:
   a first PMOS transistor having a first gate, a first drain, and a first source coupled to a first voltage VDD;
   a second PMOS transistor having a second gate coupled to the first drain, a second drain coupled to the first gate, and a second source coupled to the first voltage VDD;
   a first NMOS transistor having a third gate coupled to the first gate, a third drain coupled to the first drain, and a third source coupled to an inverse input terminal;
   a second NMOS transistor having a fourth gate coupled to the second gate, a fourth drain coupled to the second drain, and a fourth source coupled to an input terminal;
   a third NMOS transistor having a fifth gate coupled to the input terminal, a fifth drain coupled to an inverse output terminal, and a fifth source coupled to a second voltage VSS; and
   a fourth NMOS transistor having a sixth gate coupled to the inverse input terminal, a sixth drain coupled to an output terminal, and a sixth source coupled to the second voltage VSS.

6. The level-shifting circuit as claimed in claim 5, wherein the first NOMS transistor, the second NMOS transistor, the first PMOS transistor and the second PMOS transistor form a latch circuit.

7. A level-shifting circuit, comprising:
   a first PMOS transistor having a first gate, a first drain, and a first source coupled to a first voltage VDD;
   a second PMOS transistor having a second gate coupled to the first drain, a second drain coupled to the first gate, and a second source coupled to the first voltage VDD;
   a first NMOS transistor having a third gate coupled to the first gate, a third drain coupled to the first drain, and a third source coupled to an inverse input terminal;
   a second NMOS transistor having a fourth gate coupled to the second gate, a fourth drain coupled to the second drain, and a fourth source coupled to an input terminal;
   a third PMOS transistor having a fifth gate coupled to the input terminal, a fifth drain coupled to an inverse output terminal, and a fifth source coupled to the first voltage VDD; and
   a fourth PMOS transistor having a sixth gate coupled to the inverse input terminal, a sixth drain coupled to an output terminal, and a sixth source coupled to the first voltage VDD.

8. The level-shifting circuit as claimed in claim 7, wherein the first NOMS transistor, the second NMOS transistor, the first PMOS transistor and the second PMOS transistor form a latch circuit.

* * * * *